(12) United States Patent
Ishii et al.

(10) Patent No.: US 12,193,153 B2
(45) Date of Patent: Jan. 7, 2025

(54) MULTILAYER BODY

(71) Applicant: MITSUI MINING & SMELTING CO., LTD., Tokyo (JP)

(72) Inventors: Rintaro Ishii, Ageo (JP); Toshimi Nakamura, Ageo (JP); Yoshinori Matsuura, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 423 days.

(21) Appl. No.: 17/317,004

(22) Filed: May 11, 2021

(65) Prior Publication Data

US 2021/0274650 A1  Sep. 2, 2021

Related U.S. Application Data

(63) Continuation-in-part of application No. PCT/JP2019/032451, filed on Aug. 20, 2019.

(30) Foreign Application Priority Data

Nov. 20, 2018  (JP) ............... JP2018-217757

(51) Int. Cl.
*B32B 15/04* (2006.01)
*B32B 17/06* (2006.01)
*H05K 1/02* (2006.01)
*H05K 3/46* (2006.01)

(52) U.S. Cl.
CPC ......... *H05K 1/0271* (2013.01); *B32B 17/061* (2013.01); *H05K 3/4682* (2013.01)

(58) Field of Classification Search
CPC ............... B32B 17/016; C03C 21/002
USPC .................................. 428/432, 410
See application file for complete search history.

(56) References Cited

U.S. PATENT DOCUMENTS

| | | | | |
|---|---|---|---|---|
| 6,159,607 A * | 12/2000 | Hartig | ................. | C23C 14/185 |
| | | | | 427/166 |
| 6,495,251 B1 * | 12/2002 | Arbab | ................. | C23C 28/345 |
| | | | | 428/472 |
| 9,156,726 B2 * | 10/2015 | Katayama | ............ | C03C 21/002 |
| 10,273,184 B2 * | 4/2019 | Garner | ................. | B32B 17/061 |
| 10,370,288 B2 * | 8/2019 | Lambricht | ............... | C03C 4/18 |
| 10,399,894 B2 * | 9/2019 | Hotta | ................... | C03C 21/002 |

(Continued)

FOREIGN PATENT DOCUMENTS

| | | |
|---|---|---|
| CN | 108699673 A | 10/2018 |
| JP | 64-089595 | 4/1989 |

(Continued)

OTHER PUBLICATIONS

Office Action issued in CN Patent Application No. 201980065248.7, Mar. 14, 2023, translation.

(Continued)

*Primary Examiner* — Lauren R Colgan
(74) *Attorney, Agent, or Firm* — GREENBLUM & BERNSTEIN, P.L.C.

(57) ABSTRACT

There is provided a laminate that can suppress the warpage of a laminated product when used for the manufacture of the laminated product. This laminate includes a float glass substrate having a top surface and a bottom surface; and a metal layer provided on the top surface side of the float glass substrate.

7 Claims, 1 Drawing Sheet

(56) References Cited

U.S. PATENT DOCUMENTS

| | | | | |
|---|---|---|---|---|
| 2007/0059901 | A1* | 3/2007 | Majumdar | H01G 11/48 |
| | | | | 438/455 |
| 2012/0327613 | A1* | 12/2012 | Park | C03C 15/00 |
| | | | | 174/257 |
| 2014/0120335 | A1* | 5/2014 | Yamanaka | C03C 3/085 |
| | | | | 428/220 |
| 2014/0248495 | A1* | 9/2014 | Matsuda | C03C 3/087 |
| | | | | 65/30.14 |
| 2015/0072129 | A1* | 3/2015 | Okahata | C03C 21/002 |
| | | | | 428/409 |
| 2016/0023945 | A1* | 1/2016 | Suzuki | C03C 21/002 |
| | | | | 428/433 |
| 2016/0031187 | A1* | 2/2016 | Zhang | C23D 5/00 |
| | | | | 156/60 |
| 2016/0083288 | A1* | 3/2016 | Kase | C03C 3/087 |
| | | | | 428/220 |
| 2016/0282529 | A1* | 9/2016 | Miyata | G02B 5/208 |
| 2019/0013212 | A1* | 1/2019 | Matsuura | H05K 999/99 |
| 2019/0029125 | A1 | 1/2019 | Matsuura | |
| 2019/0261518 | A1* | 8/2019 | Matsuura | C23C 28/00 |
| 2019/0358934 | A1* | 11/2019 | Zhang | C03C 3/062 |

FOREIGN PATENT DOCUMENTS

| | | |
|---|---|---|
| JP | 2002-507248 | 3/2002 |
| JP | 2005-101137 | 4/2005 |
| JP | 2015-135433 | 7/2015 |
| JP | 2017-001899 | 1/2017 |
| JP | 2017-134432 | 8/2017 |
| JP | 2018-109239 | 7/2018 |
| WO | 2015/156262 | 10/2015 |
| WO | 2017/149811 | 9/2017 |

OTHER PUBLICATIONS

Chen Zhiyuan et al., Civil Engineering Materials (2nd edition), Wuhan University of Technology Press, p. 131, Jun. 2003; cited and discussed in translation of CN Office Action.

* cited by examiner

MULTILAYER BODY

CROSS-REFERENCE TO RELATED APPLICATIONS

This application is a continuation-in-part application of PCT/JP2019/032451 filed Aug. 20, 2019, which claims priority to Japanese Patent Application No. 2018-217757 filed Nov. 20, 2018, the entire contents all of which are incorporated herein by reference.

BACKGROUND OF THE INVENTION

1. Field of the Invention

The present invention relates to a laminate including a glass substrate and a metal layer (for example, a glass carrier-attached metal foil).

2. Description of the Related Art

In recent years, the multilayering of printed wiring boards has been widely performed in order to increase the mounting density of the printed wiring boards for miniaturization. Such multilayer printed wiring boards are utilized in many portable electronic apparatuses for the purpose of weight reduction and miniaturization. Further reduction of the thickness of interlayer insulating layers, and still further weight reduction as wiring boards are required of these multilayer printed wiring boards.

As a technique for satisfying such requirements, a method for manufacturing a multilayer printed wiring board using a coreless build-up process is adopted. The coreless build-up process is a method of alternately laminating (building up) insulating layers and wiring layers for multilayering, without using a so-called core substrate. For the coreless build-up process, it is proposed to use a laminate including a metal layer on a carrier to which a release function is provided by a release layer or the like for easy release between a support and a multilayer printed wiring board. For example, Patent Literature 1 (JP2005-101137A) discloses a method for manufacturing a package substrate for semiconductor device mounting, including using a carrier-attached copper foil as a laminate, affixing an insulating resin layer to the carrier surface of this carrier-attached copper foil to form a support, forming a first wiring conductor on the superthin copper layer side of the carrier-attached copper foil by steps such as photoresist processing, pattern electrolytic copper plating, and resist removal, then laminating an insulating material and performing hot pressing and the like to form a build-up wiring layer, releasing the carrier-attached supporting substrate, and removing the superthin copper layer.

It has also been recently proposed that in order to achieve further reduction of the thickness of a metal layer in a laminate, a glass substrate be used as an ultrasmooth carrier, instead of a carrier made of a metal, a carrier made of a resin, or the like conventionally typically used, and a metal layer be formed on this ultrasmooth surface. For example, Patent Literature 2 (WO2017/149811) discloses a carrier-attached copper foil in which an adhesion metal layer, a release-assisting layer, a release layer, an antireflection layer, and a superthin copper layer are formed on a carrier such as a glass sheet by sputtering.

As a glass substrate in a laminate, a float glass substrate composed of glass obtained by a float process may be used. Float glass can be obtained by supplying molten glass on a molten metal in a float bath to form a glass ribbon, and slowly cooling this glass ribbon to the strain point temperature of the glass or less, as disclosed, for example, in Patent Literature 3 (JP2017-1899A). Therefore, the float glass substrate has a surface not in contact with a molten metal during forming (hereinafter referred to as a top surface) and a surface in contact with the molten metal (hereinafter referred to as a bottom surface), derived from its manufacturing process.

CITATION LIST

Patent Literature

Patent Literature 1: JP2005-101137A
Patent Literature 2: WO2017/149811
Patent Literature 3: JP2017-1899A

SUMMARY OF THE INVENTION

It has turned out that when a laminated product (including an intermediate product) is manufactured using a laminate having a float glass substrate (for example, a glass carrier-attached metal foil), warpage occurs in the laminated product. When the laminated product (including an intermediate product) warps in this manner, for example, the breakage of the laminated product may be caused, and problems may occur in conveyance to an apparatus with height limitation in a manufacturing process.

The present inventors have now discovered that by selectively providing a metal layer on the top surface side of a float glass substrate in a laminate including the float glass substrate having a top surface and a bottom surface and the metal layer, the warpage of a laminated product can be suppressed when the laminated product is manufactured using this laminate.

Therefore, it is an object of the present invention to provide a laminate that can suppress the warpage of a laminated product when used for the manufacture of the laminated product.

According to an aspect of the present invention, there is provided a laminate comprising a float glass substrate having a top surface and a bottom surface; and a metal layer provided on the top surface side of the float glass substrate.

DESCRIPTION OF EMBODIMENT

Laminate

Figure 1:
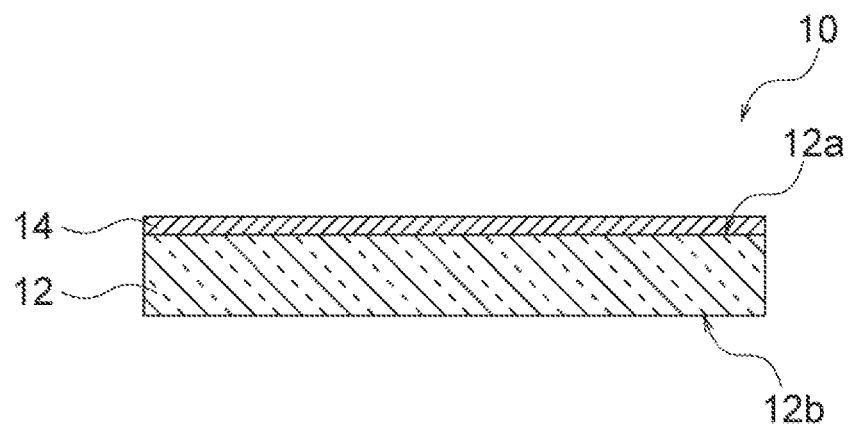
FIG. 1 is a cross-sectional schematic view showing one example of the laminate of the present invention.

One example of the laminate of the present invention is schematically shown in FIG. 1.

As shown in FIG. 1, a laminate 10 includes a float glass substrate 12 and a metal layer 14. The float glass substrate 12 has a top surface 12a and a bottom surface 12b. The metal layer 14 is provided on the top surface 12a side of the float glass substrate 12. The laminate 10 may be used in all applications but is particularly preferably used as a carrier-attached metal foil for printed wiring board manufacture. Specifically, in the laminate 10 of the present invention, all or part of the metal layer 14 is preferably releasable from the float glass substrate 12.

Figure 2:
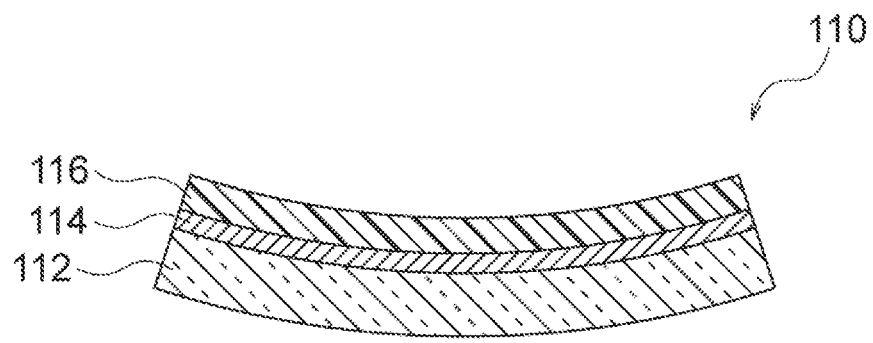
FIG. 2 is a cross-sectional schematic view for explaining warpage that occurs in a laminated product using a laminate.

By selectively providing the metal layer 14 on the top surface 12a side of the float glass substrate 12 in the laminate including the float glass substrate 12 having the top surface 12a and the bottom surface 12b and the metal layer 14, in this manner, and by manufacturing a laminated product (for example, a printed wiring board) using this laminate, the warpage of the laminated product can be suppressed. In this respect, as described above, it has turned out that when a laminated product (including an intermediate product) is manufactured using a laminate having a float glass substrate (for example, a glass carrier-attached metal foil), warpage occurs in the laminated product. For example, as shown in FIG. 2, when a laminated product 110 using a laminate is manufactured, a material having a larger coefficient of thermal expansion (CTE) than glass, such as an insulating resin 116, may be laminated on the metal layer 114 of a laminate including a float glass substrate 112 and the metal layer 114. Therefore, as the process proceeds, warpage can occur in the thickness direction of the laminated product 110 (a downward convex direction when the float glass substrate 112 is on the lower side, and the insulating resin 116 is on the upper side) due to the shrinkage of the insulating resin 116, and the like. When a laminated product warps in this manner, for example, the breakage of the laminated product may be caused, and problems may occur in conveyance to an apparatus with height limitation in a manufacturing process. For such problems, controlling warpage by changing the design of the laminated product or using a jig is considered, but both have problems such as a decrease in manufacturing efficiency.

Accordingly, the present inventors have repeatedly studied the cause of the warpage of a laminated product due to the lamination of various layers on a float glass substrate. Then, the present inventors have discovered that when various layers are laminated on the bottom surface side of a float glass substrate, the obtained laminated product warps easily in the thickness direction, and on the other hand, when the various layers are laminated on the top surface side of the float glass substrate, the warpage of the obtained laminated product is effectively suppressed. The mechanism by which this effect is achieved is not necessarily certain but is considered as follows. First, when various layers constituting a laminated product are laminated on a float glass substrate, and heat treatment or the like is performed, the various layers shrink due to differences in the coefficient of thermal expansion between the glass and the various layers (for example, a resin layer), and the like, and a force by which the various layers are rolled inward (in other words, a force by which the surface of the float glass substrate opposite to the side on which the various layers are laminated warps in a convex direction) occurs. Here, the float glass substrate has different properties from each other on the top surface side and the bottom surface side due to its manufacturing method and therefore has distortion. It is considered that this distortion of the float glass substrate promotes a force by which the top surface side warps in a convex direction, and, on the other hand, has the property of resisting a force by which the bottom surface side warps in a convex direction. Therefore, when the various layers are laminated on the bottom surface side of the float glass substrate, a force by which the top surface side of the float glass substrate warps in a convex direction occurs, and this force is promoted by the distortion of the float glass substrate, and thus warpage can occur in the thickness direction of the laminated product. On the other hand, it is considered that when the various layers are laminated on the top surface side of the float glass, a force by which the bottom surface side of the float glass warps in a convex direction occurs, but the distortion of the float glass substrate resists this force, and thus the warpage of the laminated product is effectively suppressed.

The float glass substrate 12 is composed of glass obtained by a float process. The float glass substrate 12 can be formed, for example, by a known method as shown in Patent Literature 3. The form of the float glass substrate 12 may be any of a sheet, a film, and a plate. For example, the float glass substrate 12 is preferably one that can function as a support having rigidity, such as a glass plate. More preferably, the float glass substrate 12 is glass having a coefficient of thermal expansion (CTE) of less than 25 ppm/K (typically 1.0 ppm/K or more and 23 ppm/K or less) from the viewpoint of still further preventing the warpage of a laminated product in a process involving heating. From the viewpoint of handleability and ensuring flatness during chip mounting, the float glass substrate 12 preferably has a Vickers hardness of 100 HV or more, more preferably 150 HV or more and 2500 HV or less. When glass is used as a carrier, advantages are that it is lightweight, has a low coefficient of thermal expansion, has high insulating properties, and is rigid and has a flat surface and therefore the surface of the metal layer 14 can be extremely smoothed. When the carrier is glass, it has various advantages by using the laminate 10 as a carrier-attached metal foil for printed wiring board manufacture. For example, the advantages are that when a wiring layer on a coreless support surface is formed, and then image inspection is performed, the visibility with the copper plating is excellent, that the carrier has surface flatness (coplanarity) advantageous during electronic device mounting, that the carrier has chemical resistance in desmear and various plating steps in a printed wiring board manufacturing process, and that when the float glass substrate 12 is released from the laminate 10, a chemical separation process can be adopted.

The float glass substrate 12 is preferably glass containing $SiO_2$ and more preferably glass containing 50% by weight or more of $SiO_2$, further preferably 60% by weight or more of $SiO_2$. Preferred examples of the glass constituting the float glass substrate 12 include soda lime glass or borosilicate glass, particularly preferably soda lime glass. In other words, the float glass substrate 12 is preferably a soda lime glass substrate composed of soda lime glass. When the float glass substrate 12 is a soda lime glass substrate, the soda lime glass substrate is preferably a chemically strengthened glass substrate subjected to chemical strengthening treatment because the effect of the invention can be sufficiently exhibited. The chemical strengthening treatment is typically performed by immersing glass in a molten salt. Thus, the alkali ions (for example, sodium ions) in the glass are replaced by the alkali ions (for example, potassium ions) in the molten salt having a different ionic radius, and a compressive stress layer forms on the glass surface, and thus the glass is strengthened. Therefore, it can also be said that the chemically strengthened glass substrate is a glass substrate in which at least the surface is ion-exchanged. In the chemically strengthened glass substrate, the depth of element replacement based on chemical strengthening treatment is preferably 1 μm or more and 50 μm or less, more preferably 2 μm or more and 40 μm or less, further preferably 3 μm or more and 30 μm or less, and particularly preferably 5 μm or more and 20 μm or less. By using such a chemically strengthened glass substrate as the float glass substrate 12, scratches and cracks in the substrate that can occur during a manufacturing process can be effectively suppressed, and the handleability can also be improved. On the other hand, chemically strengthened glass generally has large distortion due to the above-described chemical strengthening treatment, and therefore large warpage occurs easily in a laminated product fabricated using the chemically strengthened glass for a substrate. In contrast to this, in the present invention, the metal layer 14 is selectively provided on the top surface 12a side of the float glass substrate 12, and therefore the warpage of a laminated product fabricated using the laminate 10 can be more significantly suppressed. From the viewpoint of the thinning of a laminated product such as a printed wiring board, the thickness of the float glass substrate 12 is preferably 3 mm or less, more preferably 2.5 mm or less, further preferably 2 mm or less, particularly preferably 1.5 mm or less, and most preferably 1.2 mm or less. When the thickness is within such a range, the float glass substrate 12 generally easily has large distortion, but in the present invention, the warpage of a laminated product can be effectively suppressed, and therefore the float glass substrate 12 having the above thickness can be preferably adopted. On the other hand, from the viewpoint of improving the handleability, the thickness of the float glass substrate 12 is preferably 0.3 mm or more, more preferably 0.4 mm or more, further preferably 0.5 mm or more, particularly preferably 0.6 mm or more, and most preferably 0.7 mm or more.

The surface of the float glass substrate 12 preferably has a maximum height Rz of less than 1.0 μm, more preferably 0.001 μm or more and 0.5 μm or less, further preferably 0.001 μm or more and 0.1 μm or less, still more preferably 0.001 μm or more and 0.08 μm or less, particularly preferably 0.001 μm or more and 0.05 μm or less, and most preferably 0.001 μm or more and 0.02 μm or less as measured in accordance with JIS B 0601-2001. The maximum height Rz of the float glass substrate 12 surface smaller in this manner can provide a desirably low maximum height Rz at the outermost surface (that is, the surface opposite to the float glass substrate 12) of the metal layer 14 laminated on the float glass substrate 12 and thus is suitable, for example, for forming a wiring pattern highly fine to the extent of a line/space (L/S) of 13 μm or less/13 μm or less (for example, 12 μm/12 μm to 2 μm/2 μm) in a printed wiring board manufactured using the laminate 10.

The metal layer 14 is a layer containing a metal and may have a one-layer configuration or a multilayer configuration of two or more layers. The metal layer 14 preferably contains a metal M (M is a metal other than an alkali metal and an alkaline earth metal). The content of M in the metal layer 14 is preferably 50 atomic % or more and 100 atomic % or less, more preferably 60 atomic % or more and 100 atomic % or less, further preferably 70 atomic % or more and 100 atomic % or less, particularly preferably 80 atomic % or more and 100 atomic % or less, and most preferably 90 atomic % or more and 100 atomic % or less. The thickness of the entire metal layer 14 should be appropriately selected according to the type of the functional layer constituting the metal layer 14 and is not particularly limited but is preferably 0.1 mm or less, more preferably 0.01 mm or less, further preferably 0.005 mm or less, particularly preferably 0.002 mm or less, and most preferably 0.001 mm or less. The metal layer 14 is essentially easily influenced by the distortion of the float glass substrate 12, but in the present invention, this problem can be effectively solved, and therefore the metal layer having the above thickness can be adopted. On the other hand, the lower limit of the thickness of the entire metal layer 14 is not particularly limited but is typically 0.0001 mm or more, more typically 0.0002 mm or more. The metal layer 14 should be a layer having some function and may be at least one functional layer selected from the group consisting of, for example, an adhesion layer, a release-assisting layer, an antireflection layer, and a seed layer. Various functional layers that can constitute the metal layer 14 will be described below.

The metal layer 14 can include an adhesion layer for ensuring adhesion to the float glass substrate 12. From this viewpoint, the adhesion layer preferably contains a metal $M^1$ having a negative standard electrode potential. Examples of preferred $M^1$ include titanium, chromium, nickel, cobalt, aluminum, molybdenum, and combinations thereof (for example, alloys and intermetallic compounds), more preferably titanium, nickel, cobalt, aluminum, molybdenum, and combinations thereof, further preferably titanium, nickel, aluminum, molybdenum, and combinations thereof, particularly preferably titanium, nickel, molybdenum, and combinations thereof, and most preferably titanium. The adhesion layer may contain an element other than $M^1$ in a range that does not impair the adhesion to the float glass substrate 12. In the above respect, the content of $M^1$ in the adhesion layer is preferably 50 atomic % or more and 100 atomic % or less, more preferably 60 atomic % or more and 100 atomic % or less, further preferably 70 atomic % or more and 100 atomic % or less, particularly preferably 80 atomic % or more and 100 atomic % or less, and most preferably 90 atomic % or more and 100 atomic % or less. The metal constituting the adhesion layer may contain unavoidable impurities due to the raw material component, the film formation step, and the like. In the case of exposure to the air after the film formation of the adhesion layer, the presence of oxygen incorporated due to the exposure is allowed, which is not particularly limited. The adhesion layer is preferably a layer formed by a physical vapor deposition (PVD) process, more preferably a layer formed by sputtering. The adhesion layer is particularly preferably a layer formed by a magnetron sputtering process using a metal target, in terms of being able to improve the uniformity of film thickness distribution. The thickness of the adhesion layer is preferably 5 nm or more and 500 nm or less, more preferably 10 mm or more and 300 nm or less, further preferably 18 nm or more and 200 nm or less, and particularly preferably 20 nm or more and 100 nm or less. This thickness is a value measured by analyzing a layer cross section by a transmission electron microscope-energy dispersive X-ray spectrometer (TEM-EDX).

The metal layer 14 can include a release-assisting layer for controlling a release strength at the desired value. From this viewpoint, the release-assisting layer preferably contains a metal $M^2$ other than an alkali metal and an alkaline earth metal. Examples of preferred $M^2$ include copper, silver, tin, zinc, titanium, aluminum, niobium, zirconium, tungsten, tantalum, molybdenum, and combinations thereof (for example, alloys and intermetallic compounds), more preferably copper, silver, tin, zinc, titanium, aluminum, molybdenum, and combinations thereof, further preferably copper, silver, titanium, aluminum, molybdenum, and combinations thereof, particularly preferably copper, silver, aluminum, and combinations thereof, and most preferably copper. The release-assisting layer may contain an element other than $M^2$ in a range that does not impair the releasability of the float glass substrate 12. In the above respect, the content of $M^2$ in the release-assisting layer is preferably 50 atomic % or more and 100 atomic % or less, more preferably 60 atomic % or more and 100 atomic % or less, further preferably 70 atomic % or more and 100 atomic % or less, particularly preferably 80 atomic % or more and 100 atomic % or less, and most preferably 90 atomic % or more and 100 atomic % or less. The metal constituting the release-assisting layer may contain unavoidable impurities due to the raw material component, the film formation step, and the like. In the case of exposure to the air after the film formation of the release-assisting layer, the presence of oxygen incorporated due to the exposure is allowed, which is not particularly limited. The release-assisting layer is preferably a layer formed by a physical vapor deposition (PVD) process, more preferably a layer formed by sputtering. The release-assisting layer is particularly preferably a layer formed by a magnetron sputtering process using a metal target, in terms of being able to improve the uniformity of film thickness distribution. The thickness of the release-assisting layer is preferably 5 nm or more and 500 nm or less, more preferably 10 nm or more and 400 nm or less, further preferably 15 nm or more and 300 nm or less, and particularly preferably 20 nm or more and 200 nm or less. This thickness is a value measured by analyzing a layer cross section by a transmission electron microscope-energy dispersive X-ray spectrometer (TEM-EDX).

The metal layer 14 can include an antireflection layer for improving visibility in image inspection (for example, automatic image inspection (AOI)). Preferred examples of the metal constituting the antireflection layer include titanium, aluminum, niobium, zirconium, chromium, tungsten, tantalum, cobalt, silver, nickel, molybdenum, and combinations thereof, more preferably titanium, zirconium, aluminum, chromium, tungsten, nickel, molybdenum, and combinations thereof, further preferably titanium, aluminum, chromium, nickel, molybdenum, and combinations thereof, and particularly preferably titanium, molybdenum, and combinations thereof. These metals have the function of preventing the reflection of light and therefore can improve visibility in image inspection. The antireflection layer may be a pure metal or an alloy. The metal constituting the antireflection layer may contain unavoidable impurities due to the raw material component, the film formation step, and the like. The upper limit of the content of the metal is not particularly limited and may be 100 atomic %. The functional layer is preferably a layer formed by a physical vapor deposition (PVD) process, more preferably a layer formed by sputtering. The thickness of the antireflection layer is preferably 1 nm or more and 500 nm or less, more preferably 10 nm or more and 400 nm or less, further preferably 30 nm or more and 300 nm or less, and particularly preferably 50 nm or more and 200 nm or less.

This thickness is a value measured by analyzing a layer cross section by a transmission electron microscope-energy dispersive X-ray spectrometer (TEM-EDX).

The metal layer 14 can include a seed layer used for the formation of a wiring pattern of a printed wiring board, and the like. Preferred examples of the metal constituting the seed layer include the transition elements of groups 4, 5, 6, 9, 10, and 11, aluminum, and combinations thereof (for example, alloys and intermetallic compounds), more preferably the transition elements of groups 4 and 11, aluminum, niobium, cobalt, nickel, molybdenum, and combinations thereof, further preferably the transition elements of group 11, titanium, aluminum, molybdenum, and combinations thereof, particularly preferably copper, titanium, molybdenum, and combinations thereof, and most preferably copper. The seed layer may be manufactured by any method and may be a seed layer formed, for example, by wet film formation processes such as an electroless metal plating process and an electrolytic metal plating process, physical vapor deposition (PVD) processes such as sputtering and vacuum deposition, chemical vapor film formation, or combinations thereof. A particularly preferred seed layer is a seed layer formed by vapor phase processes such as a sputtering process and vacuum deposition from the viewpoint of easy adaptation to a fine pitch due to super-thinning, and most preferably a seed layer manufactured by a sputtering process. The seed layer is preferably an unroughened seed layer. On the other hand, when the laminate 10 is used for the manufacture of a printed wiring board, the seed layer may be one in which secondary roughening occurs by preliminary roughening, soft etching treatment, rinse treatment, or oxidation-reduction treatment, as long as wiring pattern formation during printed wiring board manufacture is not hindered. The thickness of the seed layer is not particularly limited but is preferably 10 nm or more and 1000 nm or less, more preferably 20 nm or more and 900 nm or less, further preferably 30 nm or more and 700 nm or less, particularly preferably 50 nm or more and 600 nm or less, particularly more preferably 70 nm or more and 500 nm or less, and most preferably 100 nm or more and 400 nm or less for adaptation to a fine pitch as described above. This thickness is a value measured by analyzing a layer cross section by a transmission electron microscope-energy dispersive X-ray spectrometer (TEM-EDX). The seed layer having a thickness within such a range is preferably manufactured by a sputtering process from the viewpoint of the in-plane uniformity of film formation thickness, and productivity in the form of a sheet or a roll.

The surface of the seed layer opposite to the float glass substrate 12 (the outside surface of the seed layer) preferably has an arithmetic mean roughness Ra of 1.0 nm or more and 100 nm or less, more preferably 2.0 nm or more and 40 nm or less, further preferably 3.0 nm or more and 35 nm or less, particularly preferably 4.0 nm or more and 30 nm or less, and most preferably 5.0 nm or more and 15 nm or less as measured in accordance with JIS B 0601-2001. An arithmetic mean roughness smaller in this manner is suitable, for example, for forming a wiring pattern highly fine to the extent of a line/space (L/S) of 13 μm or less/13 μm or less (for example, 12 μm/12 μm to 2 μm/2 μm) in a printed wiring board manufactured using the laminate 10.

The laminate 10 may further include a release layer between the top surface 12a side of the float glass substrate 12 and the metal layer 14 or between two or more metal layers 14. The release layer is a layer that facilitates release between the float glass substrate 12 and the metal layer 14. The release layer may be a layer which enables the release by a method of applying physical force or a layer which enables the release by a releasing method using laser (i.e., laser lift-off (LLO)). When the release layer is composed of a material which enables the release by laser lift-off, the release layer may be composed of a resin whose interfacial adhesion strength is reduced by laser irradiation after curing, or it may be a layer of silicon, silicon carbide or the like that can be modified by laser irradiation. The release layer may be either of an organic release layer and an inorganic release layer or may be a composite release layer of an organic release layer and an inorganic release layer. Examples of the organic component used for the organic release layer include nitrogen-containing organic compounds, sulfur-containing organic compounds, and carboxylic acids. Examples of the nitrogen-containing organic compounds include triazole compounds and imidazole compounds. On the other hand, examples of the inorganic component used for the inorganic release layer include metal oxides of at least one or more of nickel, molybdenum, cobalt, chromium, iron, titanium, tungsten, phosphorus, and zinc, and carbon. The release layer may be a layer containing both a metal oxide and carbon. Among these, particularly, the release layer is preferably a layer containing carbon in terms of the ease of release, film-forming properties, and the like, more preferably a layer mainly containing carbon, and further preferably a layer mainly composed of carbon or a hydrocarbon, and is particularly preferably composed of amorphous carbon, a hard carbon film. In this case, the release layer (that is, the carbon layer) preferably has a carbon concentration of 60 atomic % or more, more preferably 70 atomic % or more, further preferably 80 atomic % or more, and particularly preferably 85 atomic % or more as measured by XPS. The upper limit value of the carbon concentration is not particularly limited and may be 100 atomic % but is practically 98 atomic % or less. The release layer (particularly the carbon layer) can contain unavoidable impurities (for example, oxygen, carbon, and hydrogen derived from the surrounding environment such as the atmosphere). In the release layer (particularly the carbon layer), metal atoms can be incorporated due to the film formation method of the metal layer 14. Carbon has low interdiffusivity with a carrier and low reactivity with a carrier, and even if the laminate 10 is subjected to pressing at a temperature of more than 300° C., the formation of metallic bonds between the metal layer and the bonding interface due to high temperature heating can be prevented to maintain a state in which the release and removal of the carrier is easy. The release layer is preferably a layer formed by a vapor phase process such as sputtering in terms of suppressing excessive impurities in the amorphous carbon, and in terms of continuous productivity with the film formation of the metal layer 14 described later. The thickness of the release layer is preferably 1 nm or more and 20 nm or less, more preferably 1 nm or more and 10 nm or less. This thickness is a value measured by analyzing a layer cross section by a transmission electron microscope-energy dispersive X-ray spectrometer (TEM-EDX).

When the metal layer 14 is composed of functional layers, an adhesion layer, a release-assisting layer, an antireflection layer, and a seed layer, the laminate 10 preferably includes the adhesion layer, the release-assisting layer, the antireflection layer, and the seed layer in this order on the float glass substrate 12. When the laminate 10 further includes a release layer, the release layer is most preferably present between the release-assisting layer and the antireflection layer. The thickness of the entire laminate 10 is not particularly limited but is preferably 0.3 mm or more and 3 mm or less, more preferably 0.4 mm or more and 2 mm or less, further preferably 0.5 mm or more and 1.5 mm or less, and particularly preferably 0.7 mm or more and 1.2 mm or less.

Method for Manufacturing Laminate

The laminate 10 according to the present invention can be manufactured by providing the float glass substrate 12 and forming a metal layer on the top surface 12a side of the float glass substrate 12. In order to facilitate the release of the float glass substrate 12, a release layer is preferably formed on the top surface 12a side of the float glass substrate 12 or between two or more metal layers. For example, the laminate 10 according to a preferred aspect can be manufactured by appropriately forming various layers such as an adhesion layer, a release-assisting layer, a release layer, an antireflection layer, and a seed layer on the top surface 12a side on the float glass substrate 12. The formation of each layer of the adhesion layer, the release-assisting layer, the release layer, the antireflection layer, and the seed layer is preferably performed by a physical vapor deposition (PVD) process from the viewpoint of easy adaptation to a fine pitch due to super-thinning. Examples of the physical vapor deposition (PVD) process include a sputtering process, a vacuum deposition process, and an ion plating process, and most preferably a sputtering process in terms of being able to control film thickness in a wide range such as 0.05 nm or more and 5000 nm or less, and in terms of being able to ensure film thickness uniformity over a wide width or area, and the like. Particularly, by forming all the various layers such as the adhesion layer, the release-assisting layer, the release layer, the antireflection layer, and the seed layer by the sputtering process, the manufacturing efficiency increases significantly. For the formation of the metal layer 14, forming at least one selected from the group consisting of an adhesion layer, a release-assisting layer, an antireflection layer, and a seed layer is enough, and the formation of all these layers is not essential. The film formation by the physical vapor deposition (PVD) process should be performed according to known conditions using a known vapor phase film formation apparatus and is not particularly limited. For example, when a sputtering process is adopted, the sputtering method may include various known methods such as magnetron sputtering, a bipolar sputtering process, and a facing target sputtering process, but magnetron sputtering is preferred in terms of a fast film formation rate and high productivity. The sputtering may be performed with either of DC (direct current) and RF (radio frequency) power supplies. Also for the target shape, a widely known plate type target can be used, but a cylindrical target is desirably used from the viewpoint of target use efficiency. The film formation of each layer of the adhesion layer, the release-assisting layer, the release layer, the antireflection layer, and the seed layer by a physical vapor deposition (PVD) process (preferably a sputtering process) will be described below.

The film formation of the adhesion layer by a physical vapor deposition (PVD) process (preferably a sputtering process) is preferably performed by magnetron sputtering under a non-oxidizing atmosphere using a target composed of the above-described metal $M^1$, in terms of being able to improve film thickness distribution uniformity. The purity of the target is preferably 99.9% or more. As the gas used for sputtering, an inert gas such as argon gas is preferably used. The flow rate of argon gas should be appropriately determined according to the sputtering chamber size and the film formation conditions and is not particularly limited. From the viewpoint of continuously performing film formation without poor operation such as abnormal discharge and poor plasma irradiation, the pressure during the film formation is preferably in the range of 0.1 Pa or more and 20 Pa or less. This pressure range should be set by adjusting the film formation power and the flow rate of argon gas according to the apparatus structure, the capacity, the exhaust capacity of the vacuum pump, the rated capacity of the film formation power supply, and the like. The sputtering power should be appropriately set within the range of 0.05 W/cm$^2$ or more and 10.0 W/cm$^2$ or less per unit area of the target considering the film thickness uniformity of the film formation, productivity, and the like.

The film formation of the release-assisting layer by a physical vapor deposition (PVD) process (preferably a sputtering process) is preferably performed by magnetron sputtering under a non-oxidizing atmosphere using a target composed of the above-described metal $M^2$, in terms of being able to improve film thickness distribution uniformity. The purity of the target is preferably 99.9% or more. As the gas used for sputtering, an inert gas such as argon gas is preferably used. The flow rate of argon gas should be appropriately determined according to the sputtering chamber size and the film formation conditions and is not particularly limited. From the viewpoint of continuously performing film formation without poor operation such as abnormal discharge and poor plasma irradiation, the pressure during the film formation is preferably in the range of 0.1 Pa or more and 20 Pa or less. This pressure range should be set by adjusting the film formation power and the flow rate of argon gas according to the apparatus structure, the capacity, the exhaust capacity of the vacuum pump, the rated capacity of the film formation power supply, and the like. The sputtering power should be appropriately set within the range of 0.05 W/cm$^2$ or more and 10.0 W/cm$^2$ or less per unit area of the target considering the film thickness uniformity of the film formation, productivity, and the like.

The film formation of the release layer by a physical vapor deposition (PVD) process (preferably a sputtering process) is preferably performed under an inert atmosphere such as argon using a carbon target. The carbon target is preferably composed of graphite but can contain unavoidable impurities (for example, oxygen and carbon derived from the surrounding environment such as the atmosphere). The purity of the carbon target is preferably 99.99% or more, more preferably 99.999% or more. From the viewpoint of continuously performing film formation without poor operation such as abnormal discharge and poor plasma irradiation, the pressure during the film formation is preferably in the range of 0.1 Pa or more and 2.0 Pa or less. This pressure range should be set by adjusting the film formation power and the flow rate of argon gas according to the apparatus structure, the capacity, the exhaust capacity of the vacuum pump, the rated capacity of the film formation power supply, and the like. The sputtering power should be appropriately set within the range of 0.05 W/cm$^2$ or more and 10.0 W/cm$^2$ or less per unit area of the target considering the film thickness uniformity of the film formation, productivity, and the like.

The film formation of the antireflection layer by a physical vapor deposition (PVD) process (preferably a sputtering process) is preferably performed by a magnetron sputtering process using a target composed of at least one metal selected from the group consisting of titanium, aluminum, niobium, zirconium, chromium, tungsten, tantalum, cobalt, silver, nickel, and molybdenum. The purity of the target is preferably 99.9% or more. Particularly, the film formation of the functional layer by the magnetron sputtering process is preferably performed under an inert gas atmosphere such as argon at a pressure of 0.1 Pa or more and 20 Pa or less. The sputtering pressure is more preferably 0.2 Pa or more and 15 Pa or less, further preferably 0.3 Pa or more and 10 Pa or less. The control of the above pressure range should be performed by adjusting the film formation power and the flow rate of argon gas according to the apparatus structure, the capacity, the exhaust capacity of the vacuum pump, the rated capacity of the film formation power supply, and the like. The flow rate of argon gas should be appropriately determined according to the sputtering chamber size and the film formation conditions and is not particularly limited. The sputtering power should be appropriately set within the range of 1.0 W/cm$^2$ or more and 15.0 W/cm$^2$ or less per unit area of the target considering the film thickness uniformity of the film formation, productivity, and the like. The carrier temperature is preferably kept constant during the film formation in terms of easily obtaining stable film characteristics (for example, film resistance and crystal size). The carrier temperature during the film formation is preferably adjusted within the range of 25° C. or more and 300° C. or less and is more preferably within the range of 40° C. or more and 200° C. or less, further preferably 50° C. or more and 150° C. or less.

The film formation of the seed layer by a physical vapor deposition (PVD) process (preferably a sputtering process) is preferably performed, for example, under an inert atmosphere such as argon using a target composed of at least one metal selected from the group consisting of the transition elements of groups 4, 5, 6, 9, 10, and 11, and aluminum. The metal target such as a copper target is preferably composed of a metal such as metal copper but can contain unavoidable impurities. The purity of the metal target is preferably 99.9% or more, more preferably 99.99%, and further preferably 99.999% or more. In order to avoid temperature increase during the vapor phase film formation of the seed layer, the cooling mechanism of the stage may be provided in sputtering. From the viewpoint of stably performing film formation without poor operation such as abnormal discharge and poor plasma irradiation, the pressure during the film formation is preferably in the range of 0.1 Pa or more and 2.0 Pa or less. This pressure range should be set by adjusting the film formation power and the flow rate of argon gas according to the apparatus structure, the capacity, the exhaust capacity of the vacuum pump, the rated capacity of the film formation power supply, and the like. The sputtering power should be appropriately set within the range of 0.05 W/cm$^2$ or more and 10.0 W/cm$^2$ or less per unit area of the target considering the film thickness uniformity of the film formation, productivity, and the like.

What is claimed is:

1. A laminate comprising
a float glass substrate having a top surface and a bottom surface,
wherein the top surface is defined as a surface not in contact with a molten metal during the formation of the float glass substrate, and the bottom surface is defined as a surface in contact with a molten metal during the formation of the float glass substrate;
a release layer on the top surface side of the float glass substrate; and
a metal layer provided on the release layer opposite the float glass substrate,
wherein the release layer is composed of
an organic release layer,
an inorganic release layer, or
both an organic release layer and an inorganic release layer,
wherein the inorganic release layer is composed of at least one selected from the group consisting of carbon, silicon and silicon carbide.

2. The laminate according to claim 1, wherein the float glass substrate is a soda lime glass substrate.

3. The laminate according to claim 2, wherein the soda lime glass substrate is a chemically strengthened glass substrate.

4. The laminate according to claim 3, wherein the chemically strengthened glass substrate has a depth of element replacement based on chemical strengthening treatment of 1 μm or more and 50 μm or less.

5. The laminate according to claim 1, wherein the float glass substrate has a thickness of 3 mm or less.

6. The laminate according to claim 1, wherein the metal layer has a thickness of 0.1 mm or less.

7. The laminate according to claim 1, wherein the metal layer comprises a metal M, wherein the M is a metal other than an alkali metal and an alkaline earth metal.

* * * * *